United States Patent
Dutartre

[11] Patent Number: 5,994,676
[45] Date of Patent: Nov. 30, 1999

[54] METHOD FOR CALIBRATING THE TEMPERATURE OF AN EPITAXY REACTOR

[75] Inventor: Didier Dutartre, Meylan, France

[73] Assignee: SGS-Thomson Microelectronics S.A., Saint Genis, France

[21] Appl. No.: 08/791,385

[22] Filed: Jan. 30, 1997

Related U.S. Application Data

[60] Provisional application No. 60/019,957, Jun. 17, 1996.

[30] Foreign Application Priority Data

Jan. 31, 1996 [FR] France ................................. 96 01369

[51] Int. Cl.⁶ ............................................... H05B 1/02
[52] U.S. Cl. ........................ 219/497; 219/494; 219/505; 324/719; 392/416; 374/102
[58] Field of Search ...................... 219/497, 499, 219/505, 501, 494, 121.43; 392/416–418; 324/719, 713; 374/1, 2, 7, 9, 128, 102; 118/719; 156/345

[56] References Cited

U.S. PATENT DOCUMENTS

| | | | |
|---|---|---|---|
| 4,632,057 | 12/1986 | Price et al. .............................. | 118/719 |
| 5,114,242 | 5/1992 | Gat et al. ................................ | 374/128 |
| 5,305,417 | 4/1994 | Naim et al. ............................. | 392/418 |
| 5,396,184 | 3/1995 | Frank et al. ........................... | 324/713 |

OTHER PUBLICATIONS

French Search Report from French Patent Application 96 011369, filed Jan. 31, 1996.
Patent Abstracts of Japan, vol. 17, No. 25 (C–1017), Jan. 18, 1993 & JP–A 04 247870 (Hitachi Ltd).
Patent Abstracts of Japan, vol. 8, No. 4 ((E–220), Jan. 10, 1984 & JP–A–58 169906 (Nippon Denki).

*Primary Examiner*—Mark Paschall
*Attorney, Agent, or Firm*—Wolf, Greenfield & Sacks, P.C.

[57] ABSTRACT

A method for calibrating the temperature of an epitaxy reactor includes the steps of preparing a reference wafer having undergone on at least one of its surfaces an implant of a doping followed by an activation annealing to form a diffused layer; measuring the sheet resistance of the diffused layer at one point on the surface of the wafer; placing the reference wafer in the epitaxy reactor, the reactor being set at a desired temperature and having a neutral gas flowing therein; and measuring the sheet resistance at the same point and calculating the difference between the two values of sheet resistance, this difference representing the thermal cycle undergone by the reference wafer during its stay in the epitaxy reactor.

28 Claims, 2 Drawing Sheets

METHOD FOR CALIBRATING THE TEMPERATURE OF AN EPITAXY REACTOR

CROSS REFERENCE TO RELATED APPLICATIONS

This application claims the benefit of prior filed Provisional application Ser. No. 60/019,957, filed Jun. 17, 1996 and entitled Method For Calibrating The Temperature Of An Epitaxy Reactor.

BACKGROUND OF THE INVENTION

1. Field of the Invention

The present invention relates to the calibration of epitaxy reactors, and more specifically, to reactors likely to be used in the solid-state component industry.

2. Discussion of the Related Art

Solid-state components are being manufactured on wafers having larger and larger diameters. For example, wafers having diameters of 20 centimeters are used industrially, and there are ongoing projects to develop machines adapted to process wafers having still larger diameters. With wafers having such large diameters, processing of the wafers becomes difficult, especially processings involving vapor phase depositions, for example, depositions of epitaxied layers.

Since it is generally desirable to obtain a great number of identical components on the same layer, it is of major importance that the depositions performed have the same characteristics across the entire wafer. For this reason, the temperature at which the wafer is brought must notably correspond to a selected temperature and be uniform across the whole wafer.

FIGS. 1A and 1B very schematically show a side view and top view, respectively, of an example of an epitaxy reactor. This reactor includes a quartz chamber 1 with a cross-section generally shaped as a rectangle, with its height b being small with respect to its width l. For example, if it is desired to process wafers 10 with a diameter of 20 cm, the width clearly must be greater than 20 cm while the height need only be of a few centimeters. The top view of the chamber also has a generally rectangular shape. Gases are introduced at an injection flange 2 having an inlet nozzle 3 and are drained off at an exhaust flange 4 having an exhaust nozzle 5. Closing plates 7 and 8 can be opened to access the inside of the tube, for example, to introduce and retrieve samples to be processed. These various elements are mounted together under pressure, using O-rings 9 therebetween. The sample 10 to be processed, for example, a silicon wafer, is laid on a tray or susceptor 11. This tray generally is a rotating tray that is rotated during the processing to enhance the uniformity of the deposition.

A system for heating, for example, heating lamps 13 and 14, is arranged so as to expose to radiation the upper surface of the sample and the lower surface of the tray on which it is laid. The lamp sets 13 and 14 each are divided into several lamp subsets, for example, ten subsets. Each of the lamp subsets is adjustable independently, in order to be able, by an appropriate setting, to obtain a uniform temperature throughout wafer 10.

Of course, FIGS. 1A and 1B are extremely simplified and an actual reactor will be more complex than the system shown. Closing plates 7 and 8 preferably will be associated with robotized inlet chambers. Complex gas supplying systems also generally will be provided, and an accurate mass flowmeter will be connected in series between nozzle 3 and the source of the reaction gas(es). To ensure that the gas circulation within the chamber is uniform, several injection slots 15 extend widthwise across the chamber.

The reactor shown and described hereinabove is shown and described only as an example. Chambers made of quartz or other materials or of different shapes, for example, with a cylindrical symmetry, also may be used.

A problem that arises with such epitaxy reactors is the inability to obtain a proper temperature setting of the lamps or other means for heating silicon wafer 10.

A ring 18 often is provided around rotating tray 11, having its inner edge extremely close to the circumference of the silicon wafer and its upper surface substantially in the same plane as the silicon wafer. This ring typically supports several temperature sensors, for example, three thermocouples TF, TS and TR, which are located, respectively, upstream of the wafer (i.e. on the surface first receiving the gas flow), on one surface, and downstream of the wafer with respect to the gas flow. Moreover, a central thermocouple (not shown) generally is installed in susceptor 11. However, these thermocouples do not give an exact image of the wafer temperature. Rather, they are brought to temperatures that are different from those of the wafer. These temperatures therefore may be used only as information for correcting and regulating the temperature. Also known in the art are epitaxy reactors with temperature sensors arranged differently and/or of different types, for example, optical pyrometers. Systems for differentially controlling the power injected into the different heating areas also are used.

Conventionally, in the different existing devices for processing silicon wafers, to perform an initial calibration of a parameter such as temperature, as well as a periodical setting of the parameter, a reference wafer is placed in the device and is submitted to a specific processing (which is one of the processings usually performed by the device), and the possible setting defects of the parameter considered are inferred from the structure resulting from the processing. For example, in a device for chemical vapor deposition enabling the performance of silicon oxide depositions, the thickness of the oxide layer is analyzed in different locations on the wafer and the fluctuations of the parameter considered are inferred from the variations in this thickness. Similarly, in a rapid thermal annealing (RTA) device, which usually is used to perform activation annealings on implanted layers, a reference wafer having undergone an implant in the device is placed therein and is submitted to a high temperature rapid annealing, after which, the resistance of the activated layer is measured at different locations on the layer. The existence of thermal variations is inferred from the variations in this sheet resistance.

However, in a device for performing epitaxial depositions, that is, in devices wherein the working environment is non-oxidizing, if a thin layer is deposited epitaxially, for example, in a polysilicon deposition, the potential inhomogeneity (i.e., a variation in thickness and/or doping) of the deposition will depend only partially on the temperature, and also will depend on many other parameters, such as the composition of the deposition gas and the distribution of the gas flow across the surface of the layer. It therefore is not possible to isolate the action of the temperature parameter by these means.

In practice, it has been found that if the temperature of a silicon wafer during an epitaxial deposition is unequal while operating at high temperatures, the existence of inhomogeneities will cause crystalline defects, commonly called striplines, to appear in the wafer.

Accordingly, a method currently used to test the uniformity of the temperature in an epitaxy reactor consists of inserting a reference silicon wafer therein, submitting the wafer to a thermal cycle up to a desired temperature (for example 1050° C.), and removing the wafer from the reactor and analyzing the crystalline defects. The disadvantage of this method is that, even though the occurrence of crystalline defects reveals the existence of thermal inhomogeneities, there is no simple correlation between these thermal inhomogeneities and the crystalline defects. For example, when a strip-line is seen to appear, it can only be inferred therefrom that the temperature of the layer on both sides of this line is unequal and that the setting of the lamps needs to be modified. But, it is not known whether this modification should entail an increase or a decrease in temperature. This technique thus requires to a long trial and error process before a setting enabling the suppression of the striplines can be found. Even when this result has been achieved, however, the setting remains non-ideal. Indeed, the crystalline defects may seem to disappear as soon as the setting merely approximates the optimal setting, i.e., without actually being optimal. Further, certain types of thermal inhomogeneities do not generate crystalline defects. For example, linear temperature variations will not be detectable.

The other known methods of obtaining a uniform temperature setting also are not very satisfactory. They essentially consist of performing tests with an increased number of thermocouples attached to a reference wafer 10 and to the tray 11 receiving the wafer. For, even if these methods can obtain an accurate initial setting, they are poorly adapted to periodical resettings and are not compatible with the rotating of the wafer.

SUMMARY OF THE INVENTION

Accordingly, an object of the present invention is to provide a method for calibrating the temperature of an epitaxy reactor which is simple to implement, reliable and reproducible.

Another object of the present invention is to provide such a calibration method which is particularly sensitive.

To achieve these objects, the present invention provides an improved method for calibrating the temperature of an epitaxy reactor. According to one aspect of the present invention, the method includes the steps of:

a) preparing a reference wafer in mono-crystalline silicon having undergone on at least one of its surfaces an implant of a doping element followed by an activation annealing to form a diffused layer;

b) measuring the sheet resistance of the diffused layer at one point on the surface of the wafer;

c) placing the reference wafer in the epitaxy reactor, the reactor being set at a desired temperature and having a neutral gas flow flowing therein; and d) measuring the sheet resistance at the same point and calculating the difference between the two values of sheet resistance, this difference being related to the thermal cycle undergone by the reference wafer during its stay in the epitaxy reactor.

According to an embodiment of the present invention, the reference wafer undergoes an activation annealing and a drive-in annealing in an oxidizing atmosphere.

According to an embodiment of the present invention, the reference wafer is of a first conductivity type and the diffused layer being of a second conductivity type.

According to an embodiment of the present invention, the reference wafer is a lightly doped P-type wafer and the doping element includes arsenic.

According to an embodiment of the present invention, the resistance measurements are performed at a plurality of points on the reference wafer, variations between the differences in resistance being related to the thermal cycle undergone by the reference wafer at the points considered.

According to an embodiment of the present invention, the method further includes the step of adjusting the setting of means for heating the epitaxy reactor according to the calibration results obtained.

These objects, characteristics and advantages as well as others, of the present invention, will be discussed in detail in the following non-limiting description of a specific embodiment made with reference to the accompanying drawings.

DETAILED DESCRIPTION

The method according to the present invention uses a specific reference plate.

Figure 1A:
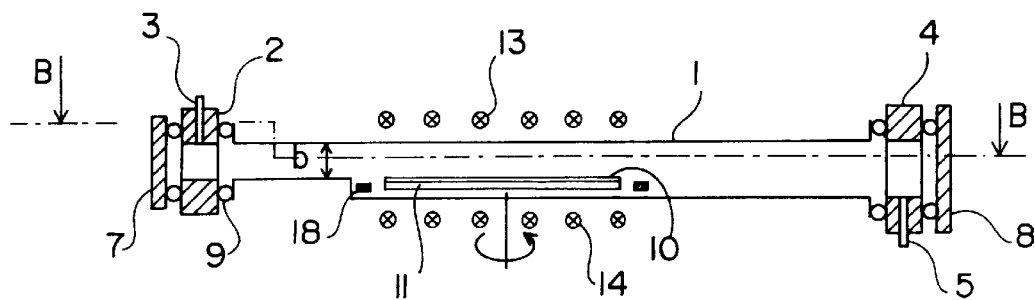
FIGS. 1A and 1B show, respectively, a side view and a top view of an example of an epitaxy reactor.
Figure 1B:
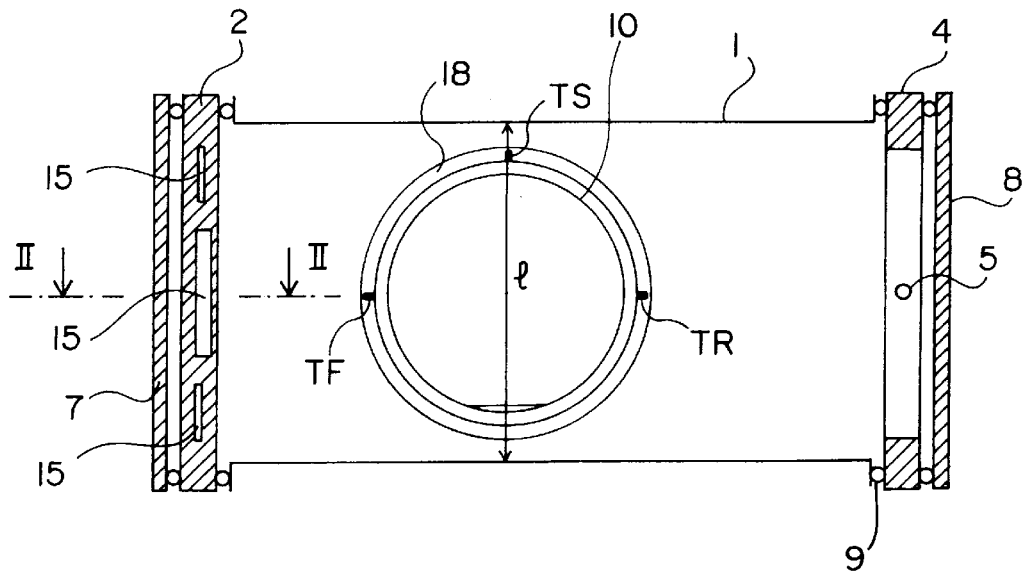
Figure 2:
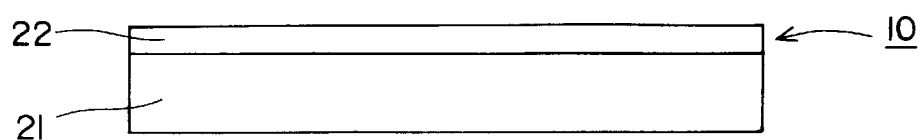
FIG. 2 shows a reference plate used according to the present invention.

As shown in FIG. 2, the reference plate is a lightly doped N or P-type silicon wafer 21. On one surface of this wafer, doping atoms are implanted, preferably, but not necessarily, of the type opposite to that of the wafer, for example, an N-type doping such as arsenic implanted in a lightly doped P-type wafer.

After the implant, an annealing sufficient to obtain a full activation (and potentially a drive-in of the doping element) is performed, thereby obtaining a diffused layer 22 at the surface of the wafer. It should be noted that, immediately after an implant, the doping atoms do not actually create a layer of a defined conductivity type in a substrate but, rather, cause a great number of dislocations and disturbances within the crystal lattice. A doped layer of a given conductivity type actually is obtained only after a so-called activation annealing is performed. After this activation annealing, a so-called drive-in annealing is performed to create a doping layer of a selected depth. According to a characteristic of the invention, this preparatory annealing step is performed in an oxidizing atmosphere so that, at the same time that the activation and the drive-in of the doping atoms are obtained, a silicon oxide layer grows at the surface of the wafer.

Figure 3:
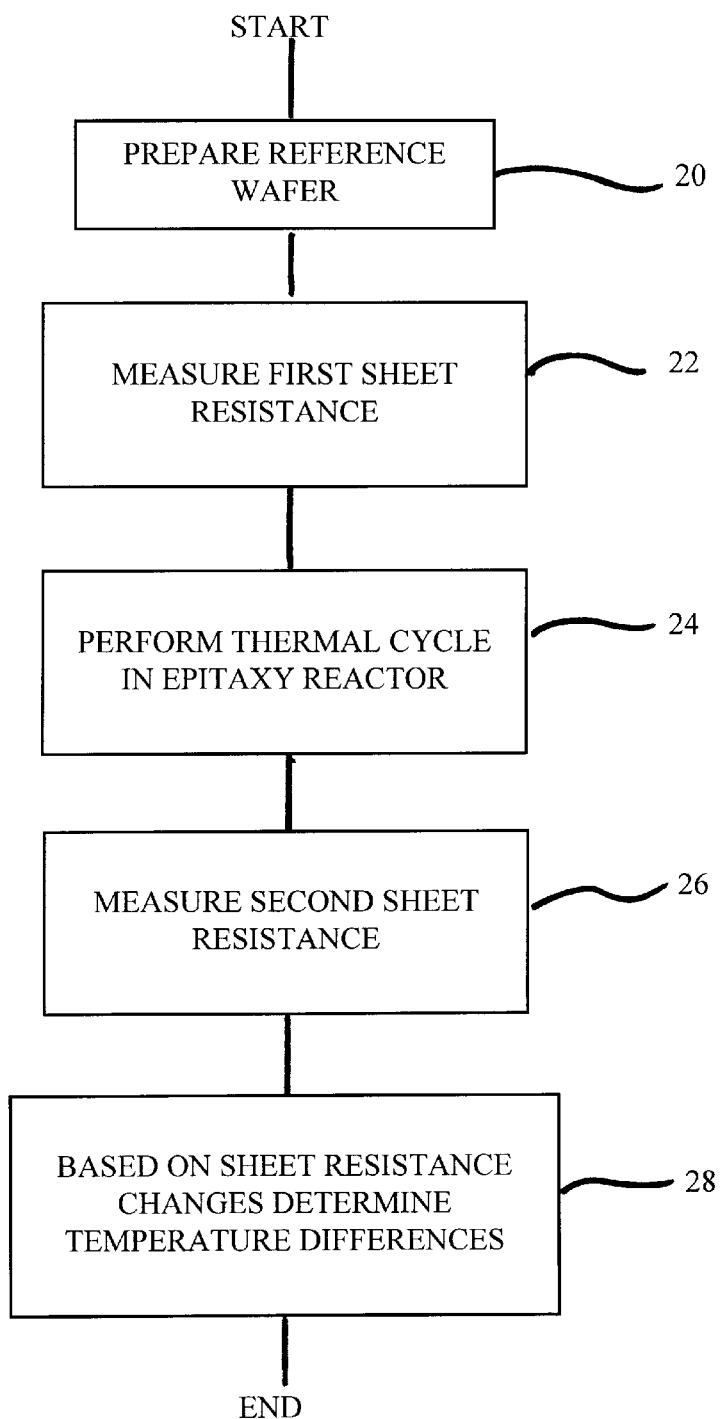
FIG. 3 shows a method according to the present invention.

This oxide layer then is suppressed and the reference wafer is prepared (step 20 shown in FIG. 3). The sheet resistance measurement is obtained (step 22) by any known method, for example, by the so-called four-pin method, at several predetermined locations on the surface of the wafer, for example, fifty locations. The reference wafer so-prepared then is placed in an inlet chamber of an epitaxy reactor to be calibrated. In the chamber, the wafer is preheated, and then automatically is inserted onto tray 11, lamps 13 and 14 being set in a manner considered at this time as optimal to obtain a selected temperature and a uniformity of this temperature (for example, a uniform temperature that is between 1000 and 1150° C.). During this thermal phase, a neutral gas is circulated in the chamber according to the flow pattern generally used for epitaxial reactions. In the present description, a neutral gas is a gas causing no deposition or epitaxial growth on reference plate 10. It can be a carrier gas such as hydrogen or a neutral gas such as argon. The pressure can be a reduced pressure or the atmospheric pressure, depending on the type of epitaxial deposition to be performed afterwards.

After this thermal step (step 24), the reference wafer is retrieved from the reactor. New sheet resistance measurements are performed at the same locations as the previous measurements (step 26), and the change in resistance at each location is noted.

These changes in resistance have shown to be substantially proportional to the temperature differences on the surface of the wafer. Moreover, the calibration (step 28) achieved by this method has proved to be extremely sensitive, as shown by the numerical values given hereafter in the case of a specific example.

EXAMPLE

A P-type conductivity reference plate was prepared from a silicon plate doped with boron at a concentration of approximately $10^{15}$ atoms/cm$^3$. On this layer, a uniform deposition of arsenic ions at a dose of $4.10^{15}$ atoms/cm$^3$ and under a power of 60 keV was performed. Then, an annealing of a duration of four hours at 1150° C. was performed in an oxidizing atmosphere, which resulted in an oxide layer having a thickness substantially equal to 1.6 µm. After this processing, the sheet resistance measurements gave values of approximately 20 ohms/square, these values having a uniformity greater than $\frac{1}{1000}$ across the entire surface of the layer.

The reference layer so obtained and measured then was placed in an epitaxy reactor and a thermal processing at 1100° C. performed thereon for six minutes. Once the wafer came out of the reactor, new resistance measurements were performed at the same locations as the first measurements. Sheet resistances of approximately 21 ohms/cm$^2$ were measured and the differences between these new values and the preceding values were calculated. These differences showed fluctuations of a few percentage points, which revealed temperature variations of a few degrees.

An extremely sensitive and reliable method for measuring the temperature of a wafer and its mapping in an epitaxy reactor under circulation of neutral gases thus has been obtained. It also has been acknowledged that the measurements obtained were practically independent of the pressure within the chamber and of the neutral gas flow. The measurement of the differences in temperature thus practically constitutes an absolute measurement of the temperature variations within the reactor and can be used directly to set the heating lamps therein.

It appears that the relatively large change in resistance (i.e., from 20 to 21 ohms) essentially resulted from an exodiffusion of the arsenic occurring in the epitaxy reactor. Conversely, this exodiffusion did not appear to occur during the preparation of the reference wafer. Indeed, during the activation and drive-in annealing, which can be performed at a high temperature and for a relatively long time, the exodiffusion can be avoided altogether because of the presence of an oxide layer.

Of course, the present invention is susceptible to various alterations, modifications, and improvements which will readily occur to those skilled in the art. In particular, doping elements other than arsenic, for example phosphorus or boron may be used. It will need to be checked, however, that the results obtained using these other doping elements are as accurate as those obtained using arsenic, for which the phenomenon of surface depletion due to evaporation and rediffusion towards the surface appears to be particularly sensitive to changes in temperature.

Although, in the described example of the invention, a very long annealing of the reference wafer was performed the reference wafer need only undergo a full activation annealing, that is, the use of a rapid thermal annealing furnace would be sufficient.

Adjustable heating means other than lamps also may be used.

The method according to the invention has been described as a method for adjusting the inhomogeneity in temperature in an epitaxy reactor by performing resistance measurements at several locations of a reference plate. This method also may be performed by taking measurements at only one point on a wafer to check, for example, when restarting an epitaxy reactor, that the conditions of a former temperature setting have been recovered.

Such alterations, modifications, and improvements are intended to be part of this disclosure, and are intended to be within the spirit and the scope of the invention. Accordingly, the foregoing description is by way of example only and is not intended to be limiting. The invention is limited only as defined in the following claims and the equivalent thereto.

What is claimed is:

1. A method for verifying a temperature of an epitaxy reactor, including the steps of:

(a) preparing a reference wafer of mono-crystalline silicon having undergone on at least one surface an implant of a doping element followed by an activation annealing to form a diffused layer;

(b) measuring a first sheet resistance of the diffused layer at at least one location on the at least one surface of the reference wafer being at a first test temperature;

(c) placing the reference wafer in the epitaxy reactor, the epitaxy reactor being set at a desired temperature using a heating system, and having a neutral gas flowing therein;

(d) measuring a second sheet resistance at the at least one location on the at least one surface of the reference wafer being at a second test temperature and calculating a relationship between the first sheet resistance and the second sheet resistance, the relationship being related to a thermal cycle undergone by the reference wafer during its stay in the epitaxy reactor; and (e) verifying the desired temperature of the heating system based on the relationship.

2. The method according to claim 1, wherein the reference wafer undergoes an activation annealing and a drive-in annealing in an oxidizing atmosphere.

3. The method according to claim 1, wherein the reference wafer is of a first conductivity type and the diffused layer is of a second conductivity type.

4. The method according to claim 3, wherein the reference wafer is a lightly doped P-type wafer and the doping element includes arsenic.

5. The method according to claim 1, further including measuring at least one of the first and second sheet resistance at a plurality of locations on the reference wafer, and determining a difference of the sheet resistances between at least two of the plurality of locations on the reference wafer, variations between the determined differences for the plurality of locations being related to a temperature differences over the plurality of locations during the thermal cycle undergone by the reference wafer.

6. The method according to claim 1 further including the step of adjusting a setting of the heating system for heating the epitaxy reactor responsive to the relationship between the first and second sheet resistances.

7. The method according to claim 5 further including the step of adjusting a setting of the heating system for heating the epitaxy reactor responsive to the variations between the differences between the sheet resistances measured for the plurality of locations to obtain selected values of the temperature difference for the plurality of locations during the thermal cycle.

8. The method according to claim 1, wherein the first and second test temperatures are approximately equal.

9. The method according to claim 7, wherein the selected values of the temperature difference for the plurality of locations are approximately zero.

10. A method for calibrating an operating parameter of a semiconductor processing device, including the steps of:
   measuring a first value of an electrical property of at least one portion of a semiconductor wafer being at a first test temperature;
   placing the wafer in the processing device, the operating parameter of the processing device being set to a particular value;
   measuring a second value of the electrical property of the at least one portion of the wafer being at a second test temperature;
   calculating a relationship between the first value and the second value of the electrical property; and
   responsive to the relationship between the first value and the second value of the electrical property, determining a proper calibration of the operating parameter.

11. The method according to claim 10, wherein:
   the step of measuring the first value of the electrical property includes measuring a first resistance at a particular location on a surface of a diffused layer included in the wafer;
   the step of measuring the second value of the electrical property includes the step of measuring a second resistance at the particular location on the surface of the diffused layer; and
   the step of calculating the relationship between the first value and the second value of the electrical property includes calculating a relationship between the first resistance and the second resistance.

12. The method according to claim 11, wherein:
   the step of placing the wafer in the processing device includes placing the wafer in a epitaxy reactor, the reactor being set to heat the wafer to a particular temperature; and
   the step of determining the proper calibration of the operating parameter includes determining the proper calibration of a temperature setting of the reactor.

13. The method according to claim 10, wherein:
   the step of placing the wafer in the processing device includes placing the wafer in an epitaxy reactor, the reactor being set to heat the wafer to a particular temperature; and
   the step of determining the proper calibration of the operating parameter includes determining the proper calibration of a temperature setting of the reactor.

14. The method according to claim 13, further comprising the step of adjusting the temperature setting of the reactor according to the determined proper calibration thereof.

15. The method according to claim 14, wherein the step of adjusting the temperature setting of the reactor includes adjusting a setting of at least one heating device included in a plurality of heating devices arranged to heat the wafer.

16. The method according to claim 10, further comprising the step of adjusting the operating parameter according to the determined proper calibration thereof.

17. The method according to claim 10, further comprising the step of preparing the wafer prior to measuring the electrical property of the at least one portion thereof, by performing the steps of:
   implanting a doping element into at least one surface of a mono-crystalline wafer; and
   annealing the mono-crystalline wafer implanted with the doping element to form a diffused layer.

18. The method according to claim 10, wherein the first and second test temperatures are approximately equal.

19. A system for verifying a temperature of an epitaxy reactor, comprising
   a reference semiconductor wafer including a conductive layer;
   a device constructed and arranged to measure a first sheet resistance of the layer at at least one location of the reference wafer being at a first test temperature, said device being arranged to measure a second sheet resistance at the at least one location of the reference wafer being at a second test temperature after undergoing a thermal cycle inside of the epitaxy reactor; and
   a processor constructed and arranged to calculate a relationship between the first sheet resistance and the second sheet resistance, the relationship being related to the thermal cycle undergone by the reference wafer, said processor being arranged to provide the relationship to the epitaxy reactor for verifying the desired temperature of a heating system of the reactor.

20. The system claim 19, wherein the first and second test temperatures are approximately equal.

21. The system of claim 19 wherein the reference wafer is a mono-crystalline silicon wafer having on at least one surface an ion implant of a doping element followed by an activation annealing to form a diffused layer.

22. The system of claim 19 wherein said device is further constructed and arranged to measure at least one of the first and second sheet resistance at a plurality of locations on the reference wafer and determine a difference of the sheet resistance between at least two of the plurality of locations on the reference wafer, the difference for the plurality of locations being related to a temperature difference over the plurality of locations during the thermal cycle undergone by the reference wafer.

23. The system of claim 22 further constructed and arranged to provide an input for adjusting a setting of a heating system of the epitaxy reactor responsive to the differences between the sheet resistances measured for the plurality of locations to obtain selected values of the temperature difference for the plurality of locations during the thermal cycle.

24. The system of claim 23 wherein the input is arranged so that the heating system is calibrated to have the selected values of the temperature difference equal to zero.

25. A system for calibrating an operating parameter of a semiconductor processing device, comprising
   a reference semiconductor wafer including a conductive layer;
   a device constructed and arranged to measure a first value of an electrical property at at least one portion of the reference wafer, the device being further constructed and arranged to measure a second value of the electrical property at the at least one portion of the reference wafer after the wafer undergoing a selected thermal cycle inside the semiconductor processing device; and a processor constructed and arranged to calculate a relationship between the first value and the second value of the electrical property and provide an input to the semiconductor processing device to calibrate the operating parameter based on the calculated relationship.

26. The system of claim 25 wherein the semiconductor processing device includes an epitaxy reactor constructed and arranged to heat the reference wafer to a selected temperature.

27. The system of claim 26 wherein the device is further constructed and arranged to measure the electrical property over a plurality of locations on the reference wafer and is further arranged to determine a difference of the measured electrical property between at least two of the plurality of locations on the reference wafer and provide the input to the epitaxy reactor to achieve a substantially uniform temperature over the plurality of locations during the thermal cycle.

28. The system of claim 27 wherein the device is further constructed and arranged to measure sheet resistance.

* * * * *